United States Patent
Uzoh

[19]

[11] Patent Number: 6,117,784
[45] Date of Patent: Sep. 12, 2000

[54] PROCESS FOR INTEGRATED CIRCUIT WIRING

[75] Inventor: Cyprian Emeka Uzoh, Hopewell Junction, N.Y.

[73] Assignee: International Business Machines Corporation, Armonk, N.Y.

[21] Appl. No.: 08/968,189

[22] Filed: Nov. 12, 1997

[51] Int. Cl.[7] .................................................. H01L 21/311
[52] U.S. Cl. ........................... 438/694; 438/745; 438/754; 427/98; 427/304; 430/313; 430/314; 204/192.15
[58] Field of Search ..................................... 430/313, 315, 430/329, 438, 314; 438/694, 745, 754; 204/192.15; 427/98, 304, 437; 205/123

[56] References Cited

U.S. PATENT DOCUMENTS

| | | | |
|---|---|---|---|
| 4,705,592 | 11/1987 | Bahrle et al. | 156/630 |
| 4,803,097 | 2/1989 | Fraenkel et al. | 427/307 |
| 5,095,132 | 3/1992 | Pinkerton | 558/56 |
| 5,126,016 | 6/1992 | Glenning et al. | 205/125 |
| 5,160,600 | 11/1992 | Patel et al. | 205/169 |
| 5,262,018 | 11/1993 | Meadow et al. | 204/82 |
| 5,326,412 | 7/1994 | Schreiber et al. | 156/150 |
| 5,342,501 | 8/1994 | Okabayashi | 205/50 |
| 5,427,895 | 6/1995 | Magnuson et al. | 430/314 |
| 5,527,423 | 6/1996 | Neville et al. | 156/636.1 |
| 5,679,982 | 10/1997 | Gardner | 257/758 |
| 5,827,604 | 10/1998 | Uno et al. | 428/209 |

FOREIGN PATENT DOCUMENTS

| | | |
|---|---|---|
| 2-45996 | 2/1990 | Japan . |
| 3-6023 | 1/1991 | Japan . |
| 5-21428 | 1/1993 | Japan . |
| 7-58201 | 3/1995 | Japan . |

*Primary Examiner*—Benjamin L. Utech
*Assistant Examiner*—Matthew Anderson
*Attorney, Agent, or Firm*—Pollock, Vande Sande & Amernick; Joseph P. Abate

[57] ABSTRACT

Metal wiring is provided in an integrated circuit by sputter coating onto a semiconductor substrate a copper seed layer; depositing and patterning a photoresist; electroplating or electrolessly plating a metal within the openings of the photoresist; stripping the remaining photoresist; and etching the copper seed layer with an etchant that preferentially etches the copper seed layer at a rate higher than that for the electroplated or electrolessly plated metal.

22 Claims, 2 Drawing Sheets

PROCESS FOR INTEGRATED CIRCUIT WIRING

TECHNICAL FIELD

The present invention is concerned with a process for fabricating metal wires in an integrated circuit. More particularly, the present invention is concerned with fabrication of copper wiring for chip interconnections and chip packaging. The methods of this invention use a thru-mask process instead of the damascene type technique to avoid problems of dishing in large metal features and erosion of insulators adjacent to comparatively large metal features.

BACKGROUND OF INVENTION

Various techniques have been investigated and used for metallizing semiconductor chips. These methods include the lift-off process, thru-mask methods, metal RIE and metal and insulator damascene and various combinations of the above methods. The lift-off and thru-mask methods are more valuable for large features like those typically encountered in chip packaging. Unlike the lift-off and the thru-mask methods, the metal RIE and damascene methods have been the process of choice for chip metallizations where the ground rules are typically below one micron.

In the damascene process, metal film is deposited over the entire patterned substrate surfaces to fill trenches and vias. This is then followed by metal planarization to remove metal overburden and isolate and define the wiring pattern. When metal deposition is by electroplating or by electroless process, the plating is preceded by the deposition of a plating base or seed layer over the entire surface of the patterned wafer or substrate. Also, layers that may improve adhesion and prevent conductor/insulator interactions or interdiffusion are deposited between the plating base or seed layer and the insulator.

In the metal RIE methods, blanket metal film is etched to define the conductor pattern. The gaps between the metal lines and vias are then filled with insulators. In high performance applications, the dielectric is planarized to define a flat metal level. One of the main advantages of the damascene process as compared to metal RIE is that it is often easier to etch an insulator as opposed to metal. Also, insulator gap fill and planarization may be more problematic. However, the last wiring level, referred to as Mlast, may not require a planar metal/insulator layer and typically is of a less dense pitch. Accordingly, the use of a damascene process may not provide a significant advantage for the last wiring level because of low thruput of the CMP step.

Moreover, this last wiring level typically contains very wide metal lines for power bussing and large pads for wirebonds or C4 solder balls. For the chemical-mechanical polishing (CMP) process, these relatively large metal structures are sensitive to dishing (see FIG. 1). Also, erosion of the insulator adjacent to large metal feature is a source of yield loss, especially when they occur at lower levels.

It would be desirable to be able to employ a process incorporating a subtractive etch or sub-etch method, for instance, thru-mask plating for depositing the metal features on a suitable seed layer. However, the most difficult aspect of the thru-mask process is the seed layer etching step.

In chip packaging wiring dimensions, the features of interest are about 5 to 30 microns in depth and about 40 to 200 microns in lateral dimensions. The plating base or seed layer are typically about 200 to 600 nm thick. Hence the loss of 500 nm in a 50–100 micron feature is not detrimental to yield or performance.

In sharp contrast to packaging features, in chip interconnection upper metal levels, the dimensions of interest are about 500–3000 nm in depth. The seed layer must be thinner than those used in packaging, typically about 30–100 nm. However, during the seed layer etching step, because the metal etching step tends to be isotropic, the profile of structures with smaller dimensions (submicron) are more degraded than their larger counterparts, as illustrated in FIG. 2. The loss of 100 nm in a 700 nm interconnection structure is a detrimental ground rule violation (see FIG. 2). Therefore, for such thru-mask method to be effective in chip wiring, particularly in the sub-micron regime, it is imperative to provide a method for removing the seed layer without significantly distorting the profile of the plated structures of interest.

SUMMARY OF INVENTION

An object of this invention is to provide a process that permits the preferential removal of a plating base or seed layer without significantly etching or distorting the plated features of interest. Moreover, an object of the present invention is to provide a process in which the desired seed layer features are defined prior to the metal deposition.

In particular, the present invention is concerned with a method for forming interconnection structure that meets the demanding wiring ground rules of high performance VLSI chips by a thru-mask method. The chip wiring metal in this invention includes metals such as electrodeposited or electrolessly deposited copper, nickel, gold, chromium, cobalt, rhodium, aluminum, platinum, silver, palladium, and their respective alloys.

In this invention, a suitable substrate with or without semiconducting devices is coated with a fine grain, high stress and highly oriented seed layer such as copper of about 20–100 nm either by metal evaporation or by metal sputtering. A photoresist is then deposited over the metal seed layer, the resist is patterned to define the conduction paths. Copper or other suitable metal is deposited by electroless or electroplating methods in the cavities defined in the resist. The photoresist is stripped to expose the underlying seed layer. The unplated seed layer is preferentially etched without significantly distorting the plated profiles of metal features with widely varying aspect ratio.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
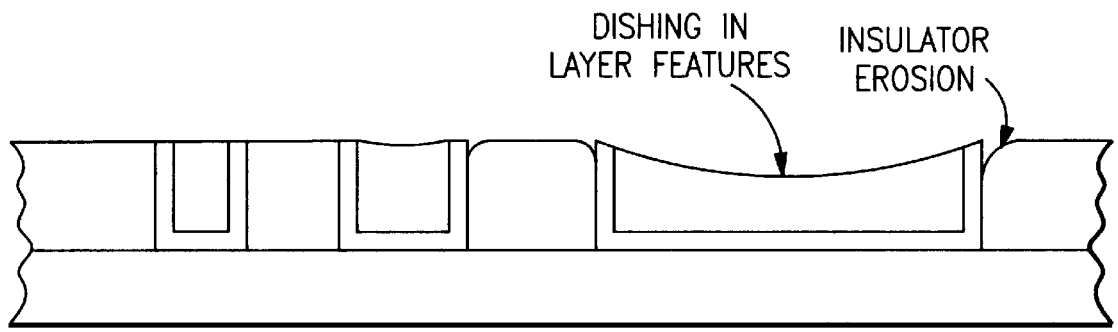
FIG. 1 illustrates prior art problem of dishing caused when using CMP.
Figure 2:
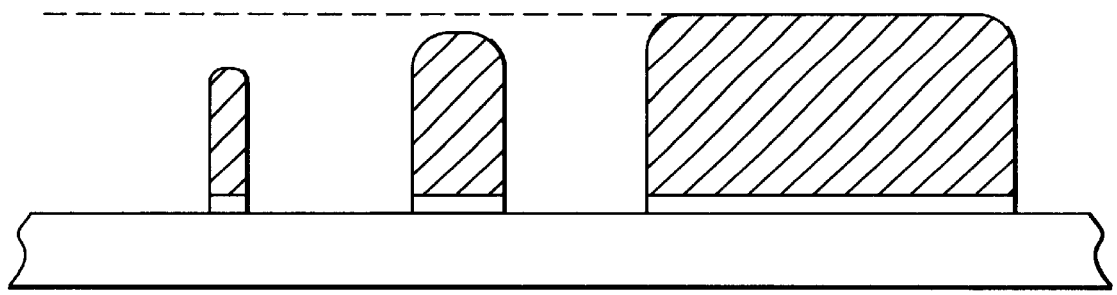
FIG. 2 illustrates prior art problem in etching process where structures with different widths are involved, resulting in large differences in their height, and distortion of texture.
Figure 3:
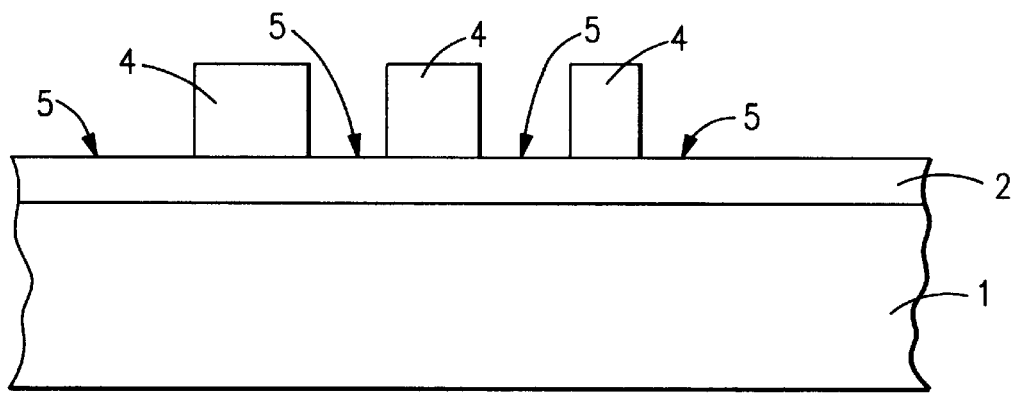
FIGS. 3, 4, 5, 6 are schematic diagrams of the sequence of steps in accordance with the present invention.

In accordance with the present invention, a thin seed layer of copper 2 (see FIG. 3) is sputtered onto a semiconductor substrate 1. Typical semiconductor substrates include silicon and group III-V semiconductors. The copper is sputtered onto the semiconductor substrate employing temperatures of less than about 100° C., preferably less than about 60° C., such as about 50 to about −10° C. The sputtering is preferably carried out in inert ambient, such as Argon. The sputtering is carried out in order to provide a seed layer of about 20 to about 100 nm, and preferably about 30 to about 70 nanometers, a typical example being 50 nanometers. The sputtering results in a copper seed layer that exhibits fine grains of about 300 Å or less, and preferably about 50 to about 300 Å, and more preferably about 100 to about 150 Å. The seed is highly stressed such as at least about $5 \times 10^9$ dynes, preferably about $5 \times 10^9$ to about $2 \times 10^{10}$ dynes and more preferably about $8 \times 10^9$ to about $1 \times 10^{10}$ dynes. Essential to the success of the present invention is achieving this fine grain, highly stressed film, and highly oriented <111> seed layer which in turn, makes it possible to preferentially etch it as compared to the subsequently electroplated copper.

Next, a photoresist 3 is deposited on the copper seed layer and then patterned using conventional lithographic techniques. Any of the well known photosensitive resist materials known in the art can be employed. The resist is typically applied by spinning on or by spraying. The photoresist employed can be a positive photoresist or a negative photoresist. A positive photoresist material is one which on exposure to imaging radiation, is capable of being rendered soluble in a solvent in which the unexposed resist is not soluble. A negative resist material is one which is capable of polymerizing and/or insolublizing upon exposure to imaging radiation. An example of a type of photoresist material is based upon phenolic-formaldehyde novolak polymers. A particular example of such is Shipley AZ-1350 which is a m-cresol formaldehyde novolak polymer composition. Such is a positive resist composition and includes therein a diazoketone such as 2-diazo-1-naphthol-5-sulfonic acid ester.

Figure 4:
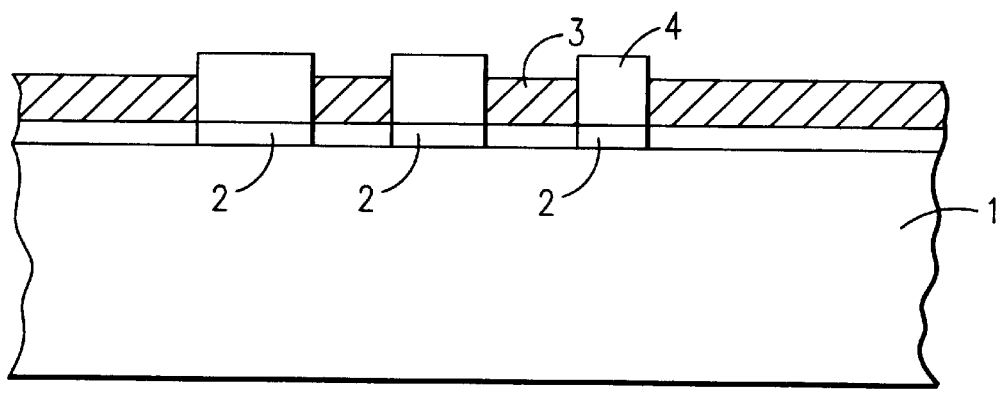

After the photoresist is patterned, a metal such as copper 4 is electroplated or electrolessly plated in the openings in the photoresist pattern (see FIG. 4). Other metals such as Au, Ni, Co, Rh, Al, Pd, Ag and/or Pt and their alloys can be used instead of or in addition to the copper. The electroplated or electrolessly plated metal is of relatively large grain, e.g. greater than about 1 micron, and relatively low stress. For instance, electroplated copper is of a relatively large grain, greater than 1 micron and low stress in the range of $-5 \times 10^8$ dyne/cm$^2$ (compressive) to about $+5 \times 10^8$ dyne/cm$^2$. Metal layer 4 is typically about 0.5 to about 3 microns thick. The copper seed layer makes it possible to plate within the openings in the photoresist and not on top of the peaks of the photoresist. Copper can be plated employing an acidic copper plating bath. The plating bath includes a source of cupric ions and an inorganic mineral acid such as sulphuric acid. The preferred source of cupric ions is $CuSO_4 \cdot 5H_2O$. Typical copper plating baths contain the source of cupric ion in an amount of about $10^{-2}$ to about 0.5 molar. The inorganic acid is added to the plating bath in an amount such that the ionic strength of the bath is typically from about 5 molar to about 9 molar, and more typically about 1.5 to about 2.5 molar.

In addition, the bath can contain other additives such as brighteners including chloride ions such as in amounts of about 30 to about 70 ppm and organic brightener additives such as polyalkylene glycols. The organic brighteners are usually added in amounts of about 0.5 to about 1.25 percent by weight of the plating bath. The preferred polyalkylene glycols include polyethylene glycol and polypropylene glycol. The more typical polyethylene glycols and polypropylene glycols usually have molecular weights of about 400 to about 1000 and more typically about 600 to about 700. Furthermore, multicomponent organic additives can be employed such as those containing a polyalkylene glycol along with an organic sulfur-containing compound such as benzene sulfonic acid, safranine-type dyes, and sulfo-organic aliphatic compounds including disulfides and/or nitrogen-containing compounds such as amides. Examples of amides include acrylamide and propylamide.

In the plating process, the structure to be plated is contacted with the plating bath. In addition, a soluble copper anode is placed in contact with the plating bath. The copper seed layer acts as a cathode upon which the electroplated copper is to be deposited. The potential is typically about −0.05 to about −0.3 volts, and more typically about −0.5 to about −0.2 volts, as measured against a $Cu^{+2}/Cu$ reference electrode at about 24° C.

The electroplating is continued until the desired thickness of the wiring is achieved. Also, the metal may be deposited by the electroless method.

Figure 5:
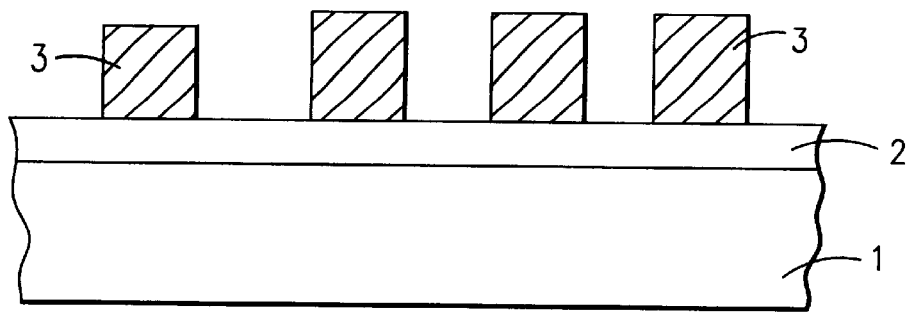
Figure 6:
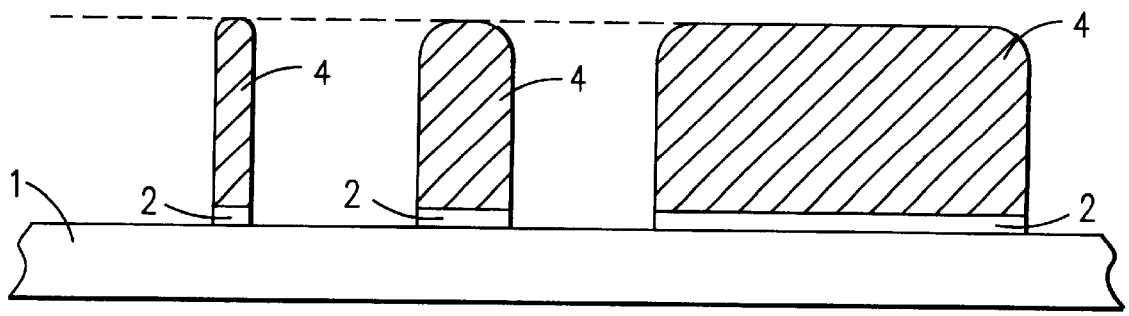

Next, the remaining photoresist layer is stripped by dissolving in a suitable solvent for the photoresist material. See FIG. 5.

After removal of the photoresist material, that portion of the copper seed layer 5 uncovered must now be removed. Moreover, such must be removed without etching or adversely affecting the electroplated or electrolessly plated metal such as copper to an undesired extent. In other words, the exposed copper seed layer 5 must be removed by an etchant that preferentially etches the seed copper as compared to the electroplated or electrolessly plated metal. Particular etchants discovered in accordance with the present invention which will result in removing the copper seed layer between the electroplated features without seriously eroding the features themselves is an etching composition containing ammonium persulfate and a surfactant available under the trade designations Alkanol ACN and MERPOL-SH from Dupont. These surfactants contain about 25 to about 50% by volume aliphatic amine ethoxylates, about 10–30% by volume isobutyl alcohol and the balance being water. The amount of Alkanol ACN or MERPOL-SH present in the composition is typically about 100 to about 800 ppm, a typical example being about 250 ppm. In addition, the ammonium persulfate present is typically about 0.5 to about 10%. Potassium or sodium persulfate or their hydrogen sulfates may be used in place of ammonium persulfate.

The etchant can also include minor amounts (e.g. 1–5% by volume) of an acid such as HCl and/or of stabilized hydrogen peroxide.

The above etchant composition preferentially etches the sputtered copper seed layer 2 at a rate of about 6:1 compared to the electroplated copper layer. For instance, a seed layer of about 50 nanometers thick can be removed between copper wires 0.7 $\mu$m×0.7 $\mu$m without seriously reducing the wire cross-section.

Moreover, the presence of the above surfactant passivates the copper and renders its surface hydrophobic, thereby preventing copper staining or corrosion. Also, the etchant formulation prevents the redeposition of particulates on the substrate.

The following non-limiting example is presented to further illustrate the present invention.

EXAMPLE

Alkanol ACN is dissolved in deionized water (DI) to make 2000 ppm by volume stock solution. Stirring is carried out for about 30 minutes to dissolve the Alkanol ACN in DI. A 5 g/l ammonium persulfate by wt. solution in DI is prepared and then acidified with sulfuric acid to pH 4. The Alkanol ACN stock solution is added to the acidified ammonium persulfate solution in an amount to provide 250 ppm by volume of the Alkanol ACN. The solution is stirred for about 20 minutes before use.

The resist is stripped from a plated substrate in a suitable solution for the resist. Next, the substrate is rinsed copiously with a DI cold water spray. The substrate is then immersed in a tank with the above Alkanol ACN/persulfate etchant solution with mild agitation. Etching is carried out about 5 minutes. The substrate is then rinsed vigorously in deionized water.

When the Alkanol ACN concentration is increased to about 500 ppm, the etch rate of copper in the ammonium persulfate solution is decreased.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for providing metal wire in an integrated circuit which comprises sputter coating copper at a temperature of less than about 100° C. and without annealing onto a semiconductor substrate to provide a copper seed layer of about 20 to about 100 nanometers; wherein said copper seed layer has grains less than about 300 Å and stress of at least about $5 \times 10^9$ dynes; depositing on said copper seed layer a photoresist and patterning said photoresist;

electroplating or electrolessly plating a metal within the openings of the patterned photoresist onto the exposed copper seed layer; stripping the remaining photoresist; and etching the exposed copper seed layer not covered by the electroplated or electrolessly plated metal using an etchant that preferentially etches said copper seed layer at a rate higher than that for the electroplated or electrolessly plated metal; and wherein said etchant comprises a persulfate and a surfactant.

2. The method of claim 1 wherein said copper seed layer has grains of about 50 to about 300 Å and stress of about $5 \times 10^9$ to about $2 \times 10^{10}$ dynes/cm$^2$.

3. The method of claim 1 wherein said sputter coating is carried out at a temperature of less than about 60° C. without annealing.

4. The method of claim 1 wherein said metal is copper.

5. The method of claim 4 wherein said etchant further passivates said copper and prevents particle redeposition on etched surfaces.

6. The method of claim 1 wherein the electroplated or electrolessly plated metal is about 0.5 to about 3 microns thick.

7. The method of claim 1 wherein the etchant preferentially etches said copper seed layer at a rate of at least three times that for the electroplated or electrolessly plated metal.

8. The method of claim 1 wherein said etchant further contains aliphatic amine ethoxylates and isobutyl alcohol.

9. The method of claim 8 wherein said etchant further contains 1–5% HCl.

10. The method of claim 8 wherein said etchant further contains stabilized 1–5% hydrogen peroxide.

11. The method of claim 1 wherein said metal is at least one metal selected from the group consisting of copper, nickel, gold, chromium, cobalt, rhodium, aluminum, platinum, silver and palladium, and their respective alloys.

12. The method of claim 1 wherein said metal is electroplated copper.

13. The method of claim 1 wherein said etchant contains ammonium persulfate.

14. The method of claim 1 wherein said metal is electroplated copper obtained from an electroplating bath comprising a source of cupric ions, an inorganic mineral and a brightener.

15. The method of claim 14 wherein said etchant preferentially etches the sputtered copper seed layer at a rate of about 6:1 compared to the electroplated copper layer.

16. The method of claim 14 wherein the electroplating bath comprises about 0.5 to about 1.25 percent by weight of an organic brightener of about 30 to about 70 ppm of an inorganic brightener containing Cl ions.

17. The method of claim 16 wherein the electroplating bath contains at least one member selected from the group consisting of an inorganic brightener containing Cl ions, a polyalkylene glycol, a sulfur containing compound and a nitrogen containing compound.

18. The method of claim 17 wherein the sulfur-containing compound is selected from the group consisting of benzene sulfonic acid, safranine dyes and sulfoorganic aliphatic compounds, and said nitrogen containing compound is an amide.

19. The method of claim 1 wherein said sputtering is carried out at temperatures of about −10° C. to about 50° C.

20. The method of claim 1 wherein the seed layer is about 30 to about 70 nanometers thick.

21. The method of claim 1 wherein said seed layer is a <111> copper layer.

22. The method of claim 1 wherein electroplated or electrolessly plated metal has a thickness of about 0.5 to 300 microns.

* * * * *